United States Patent [19]
Chang et al.

[11] Patent Number: 5,474,947
[45] Date of Patent: Dec. 12, 1995

[54] NONVOLATILE MEMORY PROCESS

[75] Inventors: Ko-Min Chang; Bruce L. Morton; Henry Y. Choe; Clinton C. K. Kuo, all of Austin, Tex.

[73] Assignee: Motorola Inc., Schaumburg, Ill.

[21] Appl. No.: 172,984

[22] Filed: Dec. 27, 1993

[51] Int. Cl.$^6$ ................................................ H01L 21/8247
[52] U.S. Cl. ................................................ 437/43; 437/52
[58] Field of Search ................................... 437/43, 48, 52

[56] References Cited

U.S. PATENT DOCUMENTS

| | | | |
|---|---|---|---|
| 4,328,565 | 5/1982 | Harari | 365/185 |
| 4,799,991 | 1/1989 | Dockrey | 156/643 |
| 4,806,201 | 2/1989 | Mitchell et al. | 437/43 |
| 4,924,437 | 5/1990 | Paterson et al. | 437/43 |
| 4,994,403 | 2/1991 | Gill | 437/43 |
| 5,063,172 | 11/1991 | Manley | 437/52 |
| 5,081,054 | 1/1992 | Wu et al. | 437/43 |
| 5,100,819 | 3/1992 | Gill et al. | 437/43 |

Primary Examiner—Tom Thomas
Attorney, Agent, or Firm—Jasper W. Dockrey

[57] ABSTRACT

A process for fabricating an improved nonvolatile memory device includes the formation of a control gate electrode (70) which overlies a floating gate electrode (42) and is separated therefrom by an inter-level-dielectric layer (62). The control gate electrode (70) and the underlying floating gate electrode (42) form a stacked gate structure (72) located in the active region (44) of a semiconductor substrate (40). An electrically insulating sidewall spacer (54) is formed at the edges of the floating gate electrode (42) and electrically isolates the control gate (70) from the semiconductor substrate (40). During the fabrication process, implanted memory regions (56, 58) are formed in the active region (44) prior to the formation of control gate electrode (70). A word-line (68) and the control gate (70) are formed by anisotropic etching of a semiconductor layer (66), which is deposited to overlie inter-level-dielectric layer (62). During the etching process, inter-level-dielectric layer (62) prevents the removal of surface portions of semiconductor substrate (40).

8 Claims, 5 Drawing Sheets

NONVOLATILE MEMORY PROCESS

FIELD OF THE INVENTION

This invention relates in general to a method for fabricating a semiconductor device, and more particularly, to a method for fabricating a non-volatile memory device.

BACKGROUND OF THE INVENTION

Advanced nonvolatile memory devices typically include a control gate electrode and an underlying floating gate electrode, which retains an electrical charge. The cell size of such a nonvolatile memory device can be large, because a number of components are necessary to form the memory array. In order to fabricate a nonvolatile memory array having a minimal surface area, the control gate electrode and the floating gate electrode can be formed by a self-aligned etch process.

FIG. 1 illustrates, in plan view, a composite masking diagram of several layers in a portion of an erasable-read-only-memory (EPROM) array arranged in accordance with the prior art. FIGS. 2-1 through 2-4 illustrate, in cross-section, process steps in accordance with the prior art for the fabrication of the EPROM device using a self-aligned etch process. The cross-sections are taken through the section line 2—2 illustrated in FIG. 1.

FIG. 2-1 illustrates, in cross-section, a portion of a semiconductor substrate 10 at a processing stage immediately prior to the self-aligned etch step. Substrate 10 is separated, at the surface, into a plurality of active device regions by a thick field oxide 12. A thin-gate oxide layer 14 overlies the surface of substrate 10 in the active device regions. Overlying the gate oxide and the field oxide is a first layer 16 of polycrystalline silicon. This polycrystalline silicon layer is used to form a floating gate electrode of the EPROM device. Overlying polycrystalline silicon layer 16 is an inter-level-dielectric (ILD) 18. The inter-level-dielectric is typically an oxide, nitride, or an oxide-nitride-oxide (ONO) layer. Gate oxide 14 is typically a thermally grown oxide having a thickness of about 10 nanometers. Polycrystalline silicon layer 16 is typically deposited by chemical vapor deposition to a thickness of about 200 nanometers, and ILD 18 is typically a composite dielectric layer having a thickness of about 30.0 nanometers.

As illustrated in FIG. 2-1, polycrystalline silicon layer 16 and ILD 18 are patterned and etched to remove portions of these layers from semiconductor substrate 10. A second polycrystalline silicon layer 20 overlies the patterned portions of layers 16 and 18, and the remaining portions of substrate 10. A photoresist layer 22 overlies second polycrystalline silicon layer 20 to act as an etch mask for a self-aligned etch process.

The self-aligned etch process begins, as illustrated in FIG. 2-2, with the removal of portions of second polycrystalline silicon layer 20 exposed by photoresist layer 22. The first step of the self-aligned etch process forms a control gate 24 and a wordline 26, removes polycrystalline silicon overlying gate oxide layer 14 in regions of substrate 10 adjacent to field oxide 12 and to wordline 26.

The self-aligned etching process continues with the removal of exposed portions of ILD 18, as illustrated in FIG. 2-3. The dielectric etching process also removes gate oxide layer 14 overlying substrate 10 leaving an exposed surface region 28 adjacent to wordline 26. As illustrated in FIG. 1., exposed surface regions 28 reside adjacent to field oxide regions 12 at a location adjacent to wordlines 26. A portion of wordline 26 functions as control gate 24 in regions where wordline 26 crosses over the active regions of substrate 10.

After etching ILD 18, exposed portions of first polycrystalline silicon layer 16 are removed, as illustrated in FIG. 2-4. The etching process forms a floating gate electrode 30 separated from control gate 24 by ILD 18. Upon completion of the self-aligned etching process, a drain region 32 is formed in substrate 10 on either side of floating gate electrode 30.

In the self-aligned etch process, the monocrystalline silicon substrate in exposed surface region 28 is unavoidably exposed to the same etchant used to pattern first polycrystalline silicon layer 16. During the step in the self-aligned etching process that forms floating gate 30, exposed surface region 28 is subjected to the etchants used to remove first polycrystalline silicon layer 16. Because semiconductor substrate 10 is typically a monocrystalline silicon material, the etching process used to form floating gate 30 also etches silicon in exposed surface region 28. The etching process removes silicon in exposed surface region 28 to a varying extent depending upon the etching characteristics of the polycrystalline silicon etch process. The unwanted removal of monocrystalline silicon in exposed surface region 28 pits the silicon surface. Pitting the substrate surface causes the development of high electric field regions in the ground plane, which degrades the performance of the EPROM device.

One technique for avoiding exposure of the substrate surface during the formation of a floating gate, such as floating gate 30, is to use a non-self-aligned etching process. In the non-self-aligned process, floating gate 30 is completely formed prior to the deposition and etching of a second polycrystalline silicon layer. Once deposited, the second polycrystalline silicon layer is patterned and etched to form a control gate electrode which overlies a portion of the substrate surface in addition to the floating gate electrode. While the non-self-aligned process avoids unwanted etching of the substrate surface, this process results in unwanted parasitic capacitance between the control gate electrode, and the substrate surface. The resulting stray capacitance increases bitline and wordline capacitive loading in the EPROM device.

SUMMARY OF THE INVENTION

In practicing the present invention there is provided an improved process for fabricating an nonvolatile memory device. In one embodiment, a substrate is provided having a first gate electrode on the substrate surface. An electrically insulating sidewall spacer is formed at the edges of the first gate electrode. An insulating layer is formed to overlie the gate electrode and a layer of semiconductor material is deposited to overlie the sidewall spacer and the insulating layer. Next, an etching process is used to form a second gate electrode overlying the first gate electrode, and separated from the first gate electrode by the insulating layer and by the sidewall spacer. The second gate electrode is also separated from the substrate by the sidewall spacer. In operation, the second gate electrode electrically controls the voltage potential of the first gate electrode.

BRIEF DESCRIPTION OF THE DRAWINGS

FIGS. 2-1 through 2-4 illustrate, in cross-section, process steps for the fabrication of an EPROM device in accordance with the prior art;

FIGS. 3-1 through 3-6 illustrate, in cross-section, process steps in accordance with one embodiment of the invention for the fabrication of an EEPROM device; FIG. 4, illustrates, in plan view, a composite diagram of an EEPROM device formed in accordance with the invention; and;

FIGS. 5-1 through 5-3 illustrate, in cross-section, process steps in accordance with another embodiment of the invention.

Figure 1:
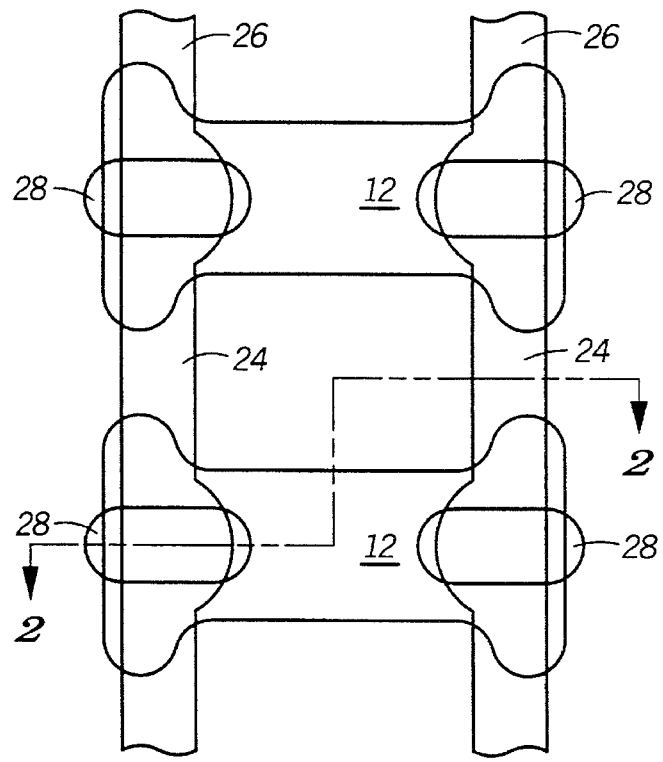
FIG. 1 illustrates, in plan view, a composite diagram of an EPROM device formed in accordance with the prior art.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

The present invention provides an improved process for the fabrication of a nonvolatile memory device. The fabrication process, in accordance with the invention, forms a stacked-gate electrode structure, in which a control gate electrode overlies and is electrically insulated from a floating gate electrode. The nonvolatile memory device, formed in accordance with the invention, exhibits improved performance over nonvolatile devices of the prior art. During the fabrication process, unwanted removal of substrate material is avoided during the formation of the stacked gate structure. Additionally, the fabrication process provides a control gate electrode which is removed from the surface of the substrate such that unwanted stray capacitance is avoided. Thus, a nonvolatile memory device formed in accordance with the invention, embodies the superior processing attributes of a non-self-aligned nonvolatile memory device, while avoiding the unwanted stray capacitance characteristic of a non-self-aligned, nonvolatile memory device. The process of the invention is fully compatible with a fabrication processes used for the manufacture of other MOS devices, such as microprocessor devices (MPU), and microcontroller devices (MCU), and the like.

Although the process of the invention can be fully utilized to form several different types of nonvolatile memory devices, the following embodiment describes the formation of an electrically-erasable-programmable-read-only-memory (EEPROM) device. Accordingly, FIGS. 3-1 through 3-6 illustrate, in cross-section, one embodiment of the invention for the fabrication of an EEPROM device. Shown in FIG. 3-1 is a portion of a semiconductor substrate 40 having already undergone several process steps in accordance with the invention. A floating gate electrode 42 overlies an active region 44 of substrate 40. A field oxide region 46 resides in substrate 40 and separates active region 44 from an adjacent active region (not shown). A thin tunnel oxide layer 48 separates floating gate electrode 42 from active region 44. A thick insulation layer 50 overlies floating gate electrode 42.

Tunnel oxide 48 is preferably formed by thermal oxidation of semiconductor substrate 40. The oxidation process is carefully controlled to grow a very thin layer of silicon dioxide having a thickness of about 100 angstroms on the surface of substrate 40. Floating gate electrode 42 is preferably formed by the chemical vapor deposition of a layer of polycrystalline silicon. The polycrystalline silicon is doped with a conductivity determining dopant either during deposition or immediately afterwards. Insulation layer 50 is preferably formed by the chemical vapor deposition of a layer of silicon dioxide to a thickness of about 4000 angstroms. Alternatively, insulation layer 50 can be a silicon dioxide layer formed by a spin-on-glass process, an atmospheric deposition process, and the like. Once the layer of insulating material is deposited, a photolithographic pattern is formed and a sequential etching process is carried out to etch the insulation layer and the polycrystalline silicon layer.

Figures 1, 2:
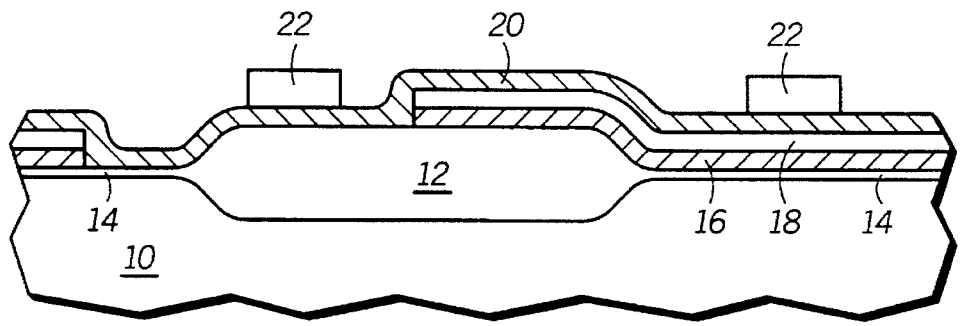
Figure 2:
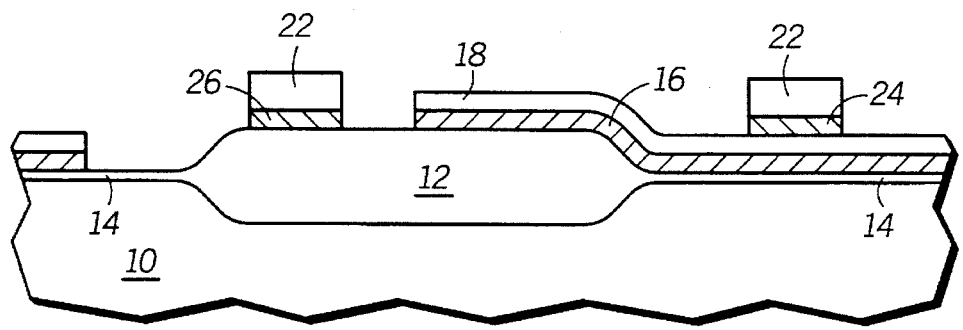
Figures 2, 3:
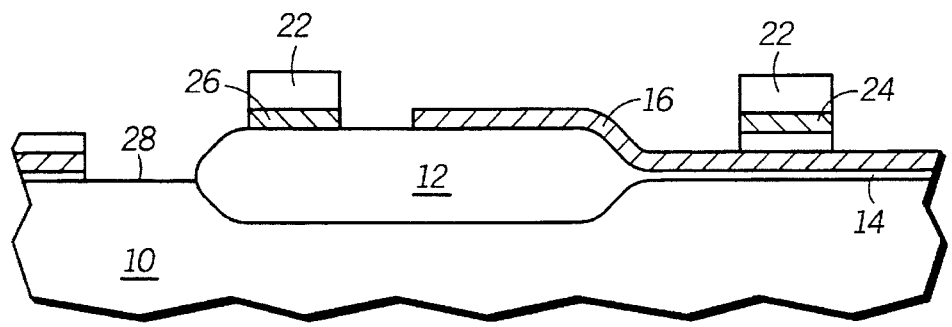

After floating gate electrode 42 is formed, an ion implant process is performed to form source-drain regions 52 in substrate 40 on either side of floating gate electrode 42, as illustrated in FIG. 3-2. In a preferred embodiment of the invention, source-drain regions 52 are formed by the ion implantation of an N-type dopant such as phosphorous or arsenic. Once source-drain regions 52 are formed, a sidewall spacer 54 is formed at the edges of insulation layer 50 and floating gate electrode 42. Sidewall spacer 54 is preferably formed by the conformal deposition of an electrically insulating material, followed by anisotropic etching. Sidewall spacer 54 can be formed by the deposition of a number of different electrically insulating materials. In accordance with the invention, insulation layer 50 must be differentially etchable with respect to sidewall spacer 54. This relationship can be achieved, for example, where insulation layer 50 is silicon dioxide, and where sidewall spacer 54 is silicon nitride.

The process of the invention continues, as illustrated in FIG. 3-3, with the removal of insulation layer 50 and the ion implantation of substrate 40 to Form memory implant regions 56 and 58. Insulation layer 50 is preferably removed by an isotropic etching process, which selectively removes insulation layer 50 while leaving sidewall spacer 54 substantially unetched. For example, in the case where insulation layer 50 is silicon dioxide and sidewall spacer 54 is silicon nitride, either a wet or dry isotropic etching process can be used employing a fluorine etchant.

The isotropic etching of insulation layer 50 Forms a cavity 60 having a bottom surface Formed by Floating gate electrode 42, and wall surfaces formed by sidewall spacer 54. Once insulation layer 50 is removed, preferably a P-type dopant, such as boron, is implanted into substrate 40. The ion implant penetrates floating gate electrode 42 to Form a memory implant region 58 in substrate 40 directly beneath floating gate electrode 42. The ion implant also forms memory implant regions 56 in substrate 40 at the junction between source-drain regions 52 and substrate 40.

The ability to Form memory implant regions 56 and 58 at this stage in the nonvolatile memory Fabrication process is a distinct advantage of the present invention. Because floating gate electrode 42 is fully formed prior to the formation of the control gate electrode, an ion implant process can be carried out that penetrates the floating gate electrode and forms a doped region in the substrate precisely aligned to the floating gate electrode. Additionally, memory implant regions 56 are formed at the source-drain junctions using the same implant process as used to form memory implant region 58. Memory implant regions 56, in combination with source-drain regions 52, Form a zener diode, which is used to regulate the drain and gate voltage of the non-volatile memory device.

Figures 2, 3, 4:
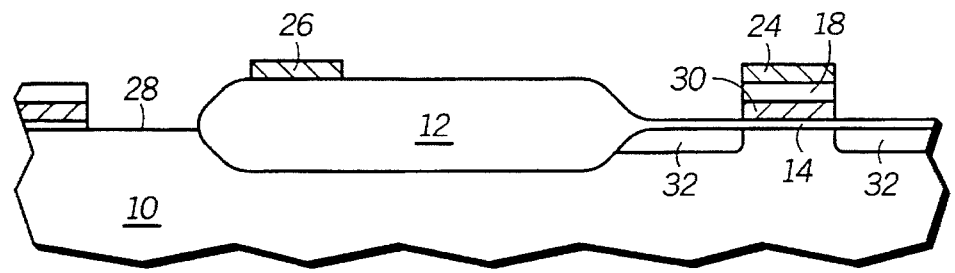

The EEPROM fabrication process of the invention continues with the formation of an ILD layer 62, as illustrated in FIG. 3-4. ILD layer 62 is preferably a composite layer, which includes a first silicon dioxide layer, a silicon nitride layer, and a second silicon dioxide layer (ONO). The second silicon oxide layer can also be an oxynitride layer. It is important to note that ILD layer 62 completely overlies substrate 40, including surface region 64 adjacent to field oxide 46 and opposite from floating gate electrode 42.

Figures 1, 3:
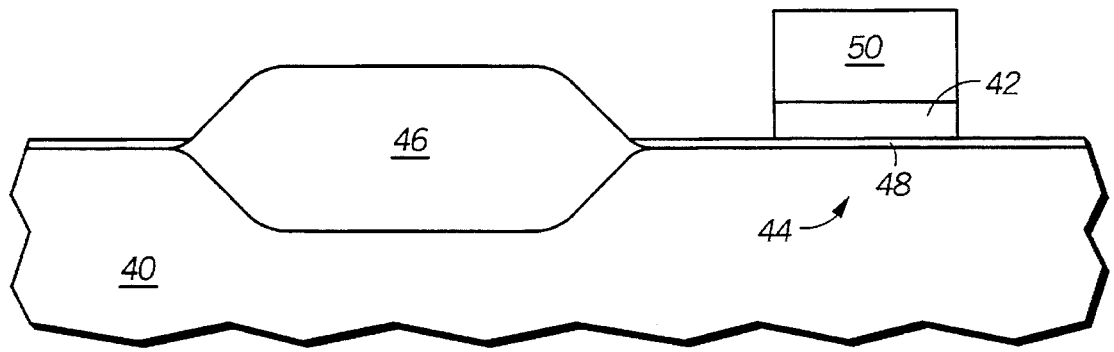
Figures 2, 3:
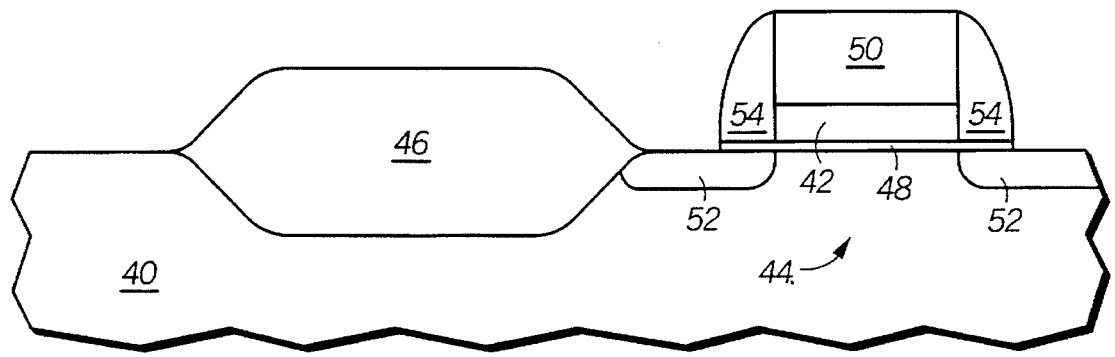
Figure 3:
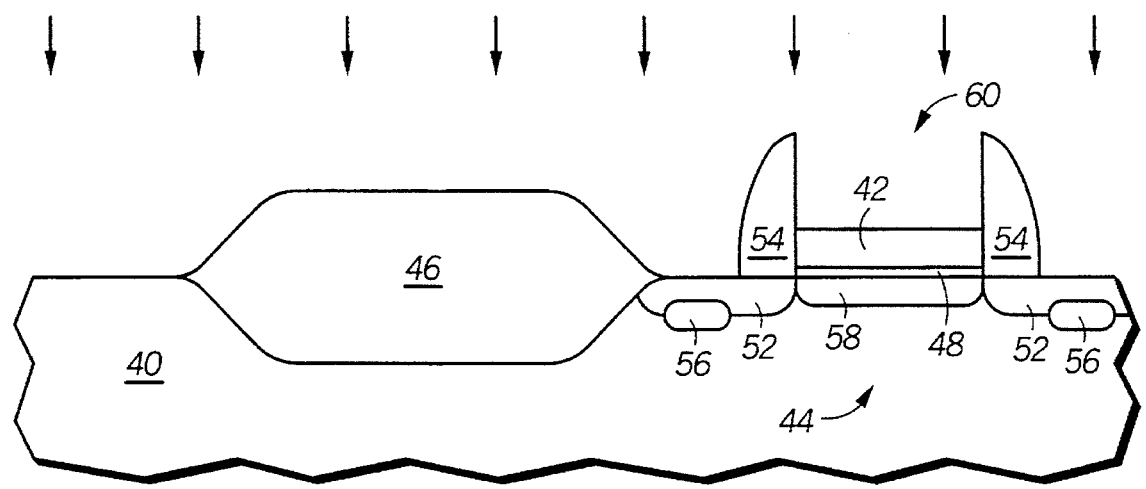
Figures 3, 4:
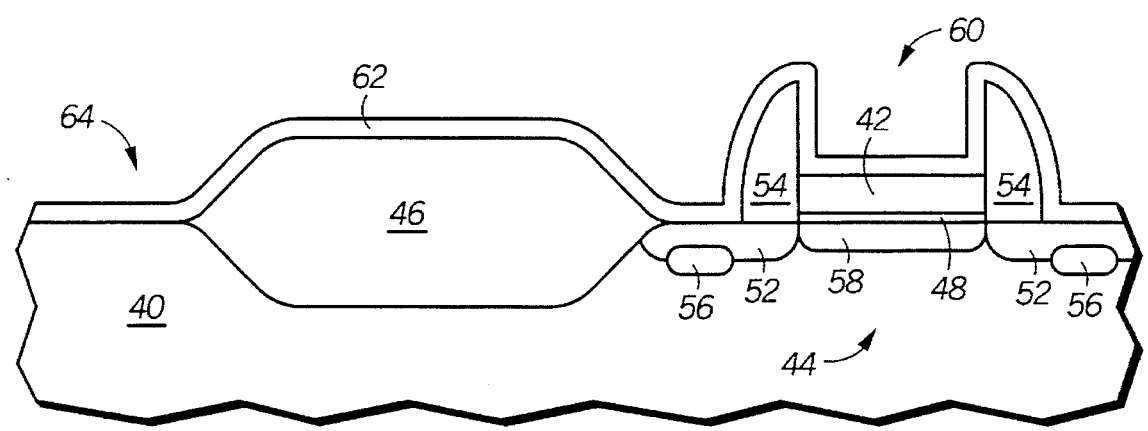
Figures 3, 4, 5:
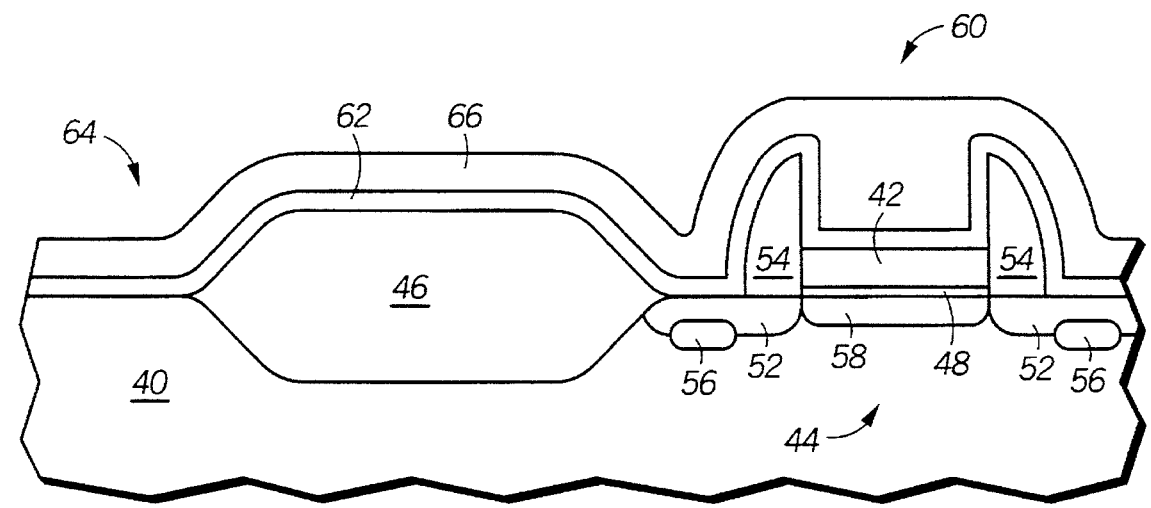
Figures 3, 4, 5, 6:
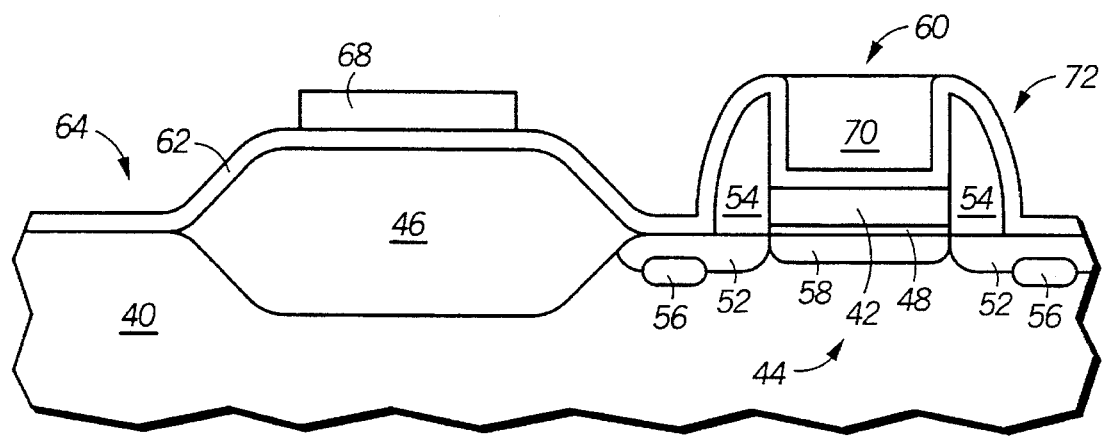
Figure 4:
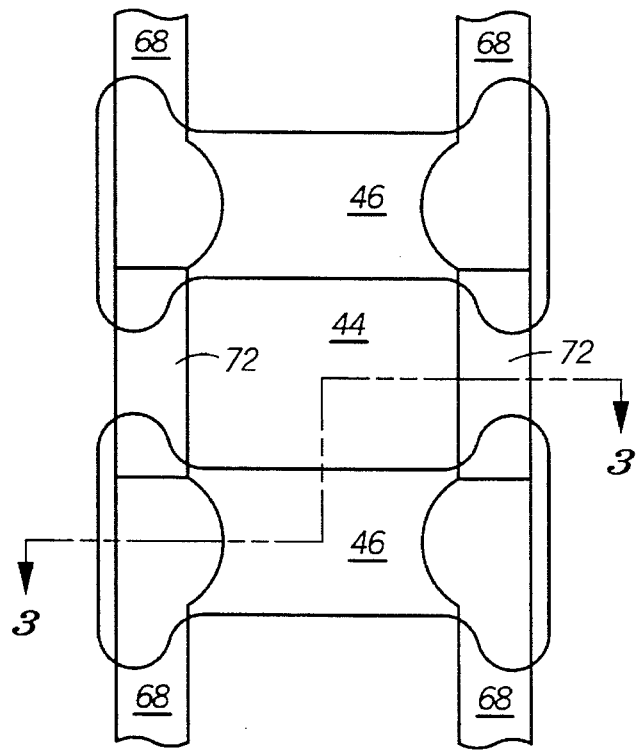
Figures 1, 5:
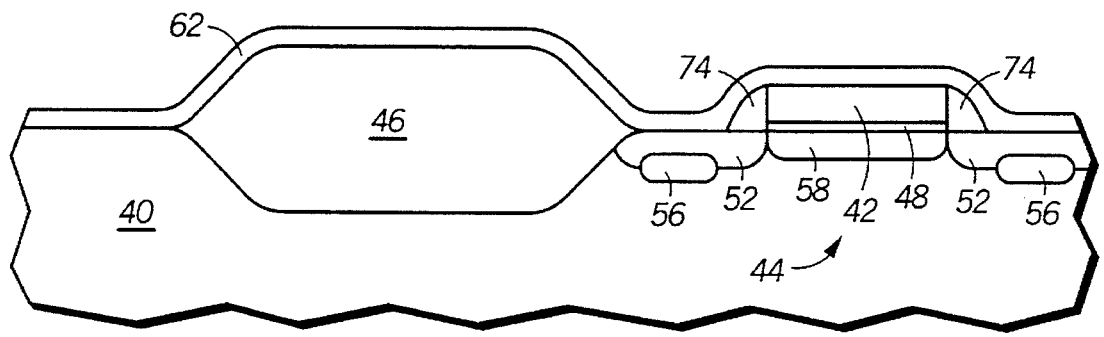
Figures 2, 5:
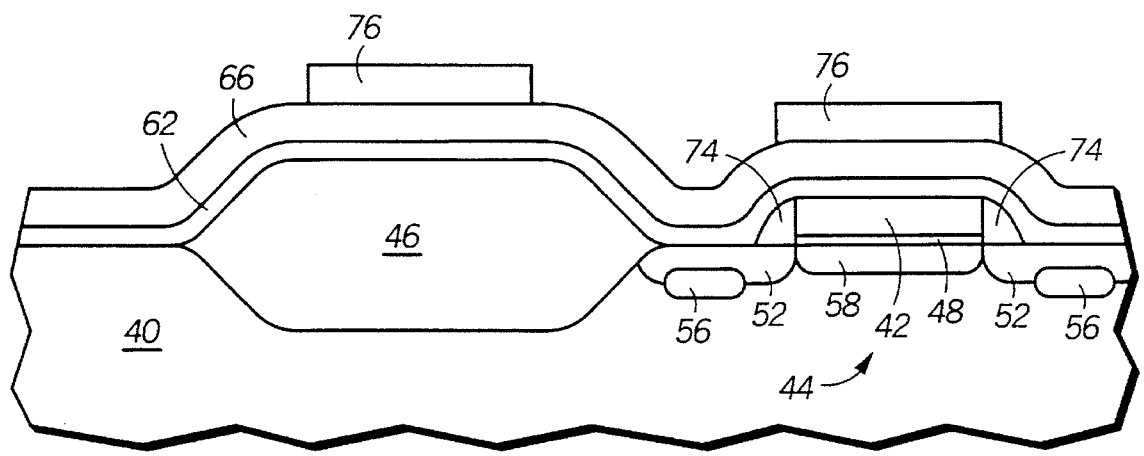
Figures 3, 5:
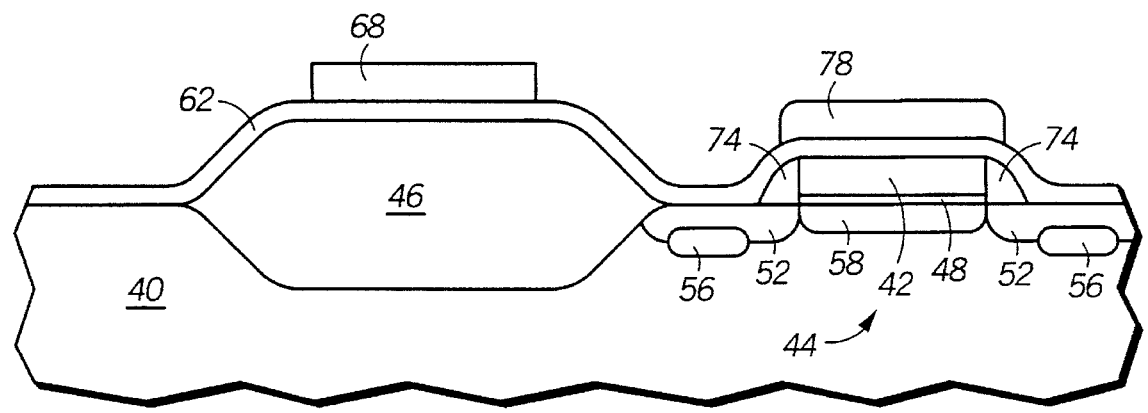

After forming ILD layer 62, a layer of semiconductor material 66 is conformally deposited to overlie the surface of substrate 40, as illustrated in FIG. 3-5. The conformal deposition process deposits semiconductor layer 66 into cavity 60 to overlie ILD layer 62 at the bottom of cavity 60 and floating gate electrode 42. Semiconductor layer 66 is preferably polycrystalline silicon deposited by chemical vapor deposition. Alternatively, semiconductor layer 66 can be another semiconductor material, such as an alloy of polycrystalline silicon and a refractory metal, or a refractory metal, or the like. Semiconductor layer 66 is doped with a conductivity determining dopant either during deposition or immediately afterwards. Preferably, semiconductor layer 66 is doped with phosphorous in order to match the conductivity of floating gate 42.

Following the deposition of semiconductor layer 66, a portion of semiconductor layer 66 is photolithographically patterned and anisotropically etched to form a word-line 68, and a control gate electrode 70, as illustrated in FIG. 3-6. Control gate 70 and floating gate 42 are the charge control components of a stacked gate structure 72. In one embodiment, the photolithographic pattern only defines the word-lines and does not cover any portion of stacked-gate structure 72. The anisotropic etching process removes portions of semiconductor layer 66 exposed by the photolithographic mask used to define word-line 68, and leaves a portion of semiconductor layer 66 in cavity 60. The portion of semiconductor layer 66 remaining in cavity 60 then functions as a control gate electrode. Alternatively, a photolithographic pattern can also be aligned to floating gate electrode 42 of stacked gate structure 72 prior to etching semiconductor layer 66. In the alternative method, a photolithographic pattern protects a portion of semiconductor layer 66 overlying floating gate electrode 42 during the etching process. Using either processing method, upon completion of the etching step, control gate electrode 70 is electrically isolated from the surface of substrate 40 by sidewall spacer 54.

It is important to note that during the etching of semiconductor layer 66, surface portion 64 is protected by ILD layer 62. Inter-level-dielectric layer 62 prevents unwanted etching of substrate 40 at surface region 64. One of the advantages of the present invention is readily apparent by comparison of the process of the invention, as illustrated in FIGS. 3-5 and 3-6 with the process of the prior art, illustrated in FIGS. 2-2 to 2-4. In the prior art process, insulation layers, such as gate oxide 14, overlying exposed region 28 are removed during the final stages of the self-aligned etching process. When polycrystalline silicon layer 16 is etched to form the floating gate, bare silicon in region 28 is exposed to the etching process. However, in the present invention, since floating gate electrode 42 is completely formed, the final etching process that is carried out to complete the formation of the stacked gate structure cannot attack bare silicon. The etching of bare silicon is prevented by ILD layer 62.

An EEPROM device formed in accordance with the foregoing embodiment can attain high performance operation as a result of the improved fabrication process. Because sidewall spacer 54 resides between source-drain regions 52 and control gate 70, stray capacitive coupling between substrate 40 and control gate 70 is minimized. Additionally, as previously described, pitting of the substrate in regions adjacent to field oxide 46 is avoided. In extreme cases, pitting of the substrate adjacent to field oxide 46 can cause high electric field regions to arise in the ground plane, which supplies a ground signal to the EEPROM device. Additionally, in a flash EEPROM device, the source bus can experience a high voltage potential. The high voltage causes current leakage from the source bus slowing the erase cycle of the EPROM cell.

Shown in FIG. 4, in plan view, is a composite diagram of an EEPROM device formed in accordance with the invention. The cross-sectional view illustrated in FIG. 3-6 is taken along section line 3—3 of FIG. 4. The portions of word-lines 68 that include stacked gate structure 72 reside over active region 44 intermediate to field oxide regions 46. The absence of an unwanted exposed surface region, designated as region 28 in prior art FIG. 1, is readily apparent from a comparison of FIGS. 1 and 4.

FIGS. 5-1 through 5-3 illustrate process steps in the fabrication of a nonvolatile memory device in accordance with another embodiment of the invention. FIG. 5-1 illustrates, in cross-section, a portion of substrate 40 already having undergone several process steps in accordance with this embodiment of the invention. Floating gate electrode 42 resides over active region 44 and overlies implanted memory region 58. Floating gate 42 and tunnel oxide layer 48 are formed in a manner analogous to the preceding embodiment. Once floating gate 42 is formed, an ion implant process is carried out to form source-drain regions 52. Next, a sidewall spacer 74 is formed at the edges of control gate 42, and an ion implant step is carried out to form memory implant regions 56. Thereafter, ILD layer 62 is deposited to overlie the surface of substrate 40, including floating gate 42 and sidewall spacer 74.

Following the formation of ILD layer 62, semiconductor layer 66 is deposited to overlie ILD layer 62, as illustrated in FIG. 5-2. A photolithographic pattern 76 is formed to overlie semiconductor layer 66. Photolithographic pattern 76 is aligned to floating gate 42 and overlies a portion of sidewall spacer 74.

Next, semiconductor layer 66 is anisotropically etched using photolithographic pattern 76 as an etch mask. The etching process forms word-line 68 and a control gate electrode 78, as illustrated in FIG. 5-3. It is important to note that during the anisotropic etching of semiconductor layer 66, no surface portions of substrate 40 are exposed to the etching process. Additionally, although control gate 78 is formed by a non-self-aligned etching process, control gate 78 is separated from substrate 40 by sidewall spacer 74 and by ILD layer 62. Accordingly, the nonvolatile memory device formed in accordance with this embodiment also offers improved performance by avoiding unwanted capacitive coupling between the control gate and the substrate. Furthermore, an improved nonvolatile memory device is formed in accordance with this embodiment of the invention through the use of a reduced number of processing steps.

Thus it is apparent that there has been provided, in accordance with the invention, an improved process for fabricating a nonvolatile memory device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, deep ultraviolet (DUV) and X-ray exposure techniques can be used to define a lithographic patterns, and etching process such as electron cyclotron resonance (ECR) etching can be used to etch the various layers. It is therefore intended to include within the invention all such variations and modifications as fall within the scope of the appended claims and equivalents thereof.

We claim:

1. A process for fabricating a nonvolatile memory device comprising the steps of:

provinding a substrate having a first gate electrode thereon;

forming source and drain region in the substrate on either side of the first gate electrode;

forming an electrically insulating sidewall spacer at the edges of the first gate electrode:

forming an insulating layer overlying the gate electrode; implanting dopant atoms through the first gate electrode and into the substrate to form a doped channel region in the substrate directly beneath the first gate electrode, and to form zener diode regions in the substrate beneath the source and drain regions;

depositing a layer of semiconductor material to overlie the sidewall spacer and the insulating layer; and etching the semiconductor layer to form a second gate electrode overlying the first gate electrode and separated therefrom by the insulating layer and by the sidewall spacer, wherein the second gate electrode is separated from the substrate by the sidewall spacer, and wherein the second gate electrode electrically controls the voltage potential of the first gate electrode.

2. The process of claim 1, wherein the insulating layer comprises a first silicon dioxide layer, a layer of silicon nitride overlying the first silicon dioxide layer, and a second layer of silicon dioxide overlying the silicon nitride layer.

3. The process of claim 1, wherein the insulating layer comprises a layer of silicon dioxide deposited by chemical vapor deposition.

4. A process for fabricating a nonvolatile memory device comprising the steps of:

providing a substrate having a first gate electrode thereon;

forming an insulating layer overlying the gate electrode;

forming an electrically insulating sidewall spacer at the edges of the insulating layer and the first gate electrode;

removing the insulating layer;

forming a dielectric layer to overlie the first gate electrode and the sidewall spacer;

depositing a layer of semiconductor material to overlie the sidewall spacer and the dielectric layer; and etching the semiconductor layer to form a second gate electrode overlying the first gate electrode and separated therefrom by the dielectric layer and by the sidewall spacer, wherein the second gate electrode is separated from the substrate by the sidewall spacer, and wherein the second gate electrode electrically controls the voltage potential of the first gate electrode.

5. The process of claim 4, wherein the step of forming a dielectric layer comprises sequentially forming a first silicon dioxide layer, a layer of silicon nitride overlying the first silicon dioxide layer, and a second layer of silicon dioxide overlying the silicon nitride layer.

6. The process of claim 4, further comprising the steps of:

forming source and drain region in the substrate on either side of the first gate electrode; and implanting dopant atoms through the first gate electrode and into the substrate to form a doped channel region in the substrate directly beneath the first gate electrode, and to form zener diode regions in the substrate beneath the source and drain regions.

7. The process of claim 4, wherein the step of removing the insulating layer leaves a recessed region bounded by the sidewall spacer, and wherein the step of depositing a semiconductor layer fills the recessed region, and wherein the step of etching the semiconductor layer comprises anisotropic etching to remove semiconductor material from the substrate while leaving a portion of the semiconductor layer in the recess to form the second gate electrode.

8. The process of claim 7 further comprising the step of forming an etching mask on the semiconductor layer prior to anisotropically etching the semiconductor layer.

\* \* \* \* \*